United States Patent
Xu

(10) Patent No.: US 12,133,427 B2
(45) Date of Patent: Oct. 29, 2024

(54) DISPLAY SUBSTRATE INCLUDING LIGHT SHIELDING LAYER HAVING MULTIPLE IMAGING PINHOLES FORMED THEREIN AND METHOD FOR MANUFACTURING THE SAME, DISPLAY PANEL AND DISPLAY DEVICE

(71) Applicants: Beijing BOE Technology Development Co., Ltd., Beijing (CN); BOE Technology Group Co., Ltd., Beijing (CN)

(72) Inventor: Chen Xu, Beijing (CN)

(73) Assignees: Beijing BOE Technology Development Co., Ltd., Beijing (CN); BOE Technology Group Co., Ltd., Beijing (CN)

(*) Notice: Subject to any disclaimer, the term of this patent is extended or adjusted under 35 U.S.C. 154(b) by 573 days.

(21) Appl. No.: 17/298,697

(22) PCT Filed: Oct. 19, 2020

(86) PCT No.: PCT/CN2020/121787
§ 371 (c)(1),
(2) Date: Jun. 1, 2021

(87) PCT Pub. No.: WO2021/093519
PCT Pub. Date: May 20, 2021

(65) Prior Publication Data
US 2022/0052139 A1    Feb. 17, 2022

(30) Foreign Application Priority Data
Nov. 15, 2019   (CN) .......................... 201911117696.5

(51) Int. Cl.
*H10K 59/126*   (2023.01)
*G06V 40/13*    (2022.01)
(Continued)

(52) U.S. Cl.
CPC ....... *H10K 59/126* (2023.02); *G06V 40/1318* (2022.01); *H10K 59/65* (2023.02); *H10K 59/1201* (2023.02)

(58) Field of Classification Search
CPC .. H10K 59/126; H10K 59/65; H10K 59/1201; H10K 59/12; G06V 40/1318
(Continued)

(56) References Cited

U.S. PATENT DOCUMENTS 3,643,139 A * 2/1972 Nienhuis ............... H01L 23/522
                                                          327/434
9,292,914 B2   3/2016 Lee et al.
(Continued)

FOREIGN PATENT DOCUMENTS

CN   105321986 A   2/2016
CN   107977632 A   5/2018
(Continued)

OTHER PUBLICATIONS

PCT/CN2020/121787 International search report and written opinion.
CN201911117696.5 first office action.

*Primary Examiner* — Duy T Nguyen
(74) *Attorney, Agent, or Firm* — IPro, PLLC

(57) ABSTRACT

A display substrate, a manufacturing method thereof, a display panel and a display device are provided. The display substrate includes: an array layer on a base substrate and a light shielding layer on a side of the array layer away from the base substrate, wherein the array layer includes a driving transistor and a switching transistor, the switching transistor is a transistor connected to a gate electrode of the driving transistor, a plurality of imaging pinholes are formed in the light shielding layer, and a first orthographic projection of the imaging pinholes onto the base substrate and a second orthographic projection of an active layer pattern of the (Continued)

switching transistor in the array layer onto the base substrate do not overlap at least in part.

13 Claims, 11 Drawing Sheets

(51) Int. Cl.
*H10K 59/12* (2023.01)
*H10K 59/65* (2023.01)

(58) Field of Classification Search
USPC .......................................................... 257/40
See application file for complete search history.

(56) References Cited

U.S. PATENT DOCUMENTS

| | | | |
|---|---|---|---|
| 2015/0098643 A1 | 4/2015 | Lee et al. | |
| 2016/0035811 A1 | 2/2016 | Choi et al. | |
| 2016/0125791 A1* | 5/2016 | Park | H02M 3/1584 |
| | | | 345/76 |
| 2017/0012097 A1 | 1/2017 | Choi et al. | |
| 2017/0141175 A1* | 5/2017 | Park | H10K 59/123 |
| 2018/0040682 A1* | 2/2018 | Ebisuno | H10K 59/8791 |
| 2018/0175077 A1* | 6/2018 | Koo | H10K 59/126 |
| 2019/0156097 A1* | 5/2019 | Liu | H10K 59/65 |
| 2019/0172887 A1* | 6/2019 | Sun | H10K 59/126 |
| 2020/0004381 A1* | 1/2020 | Han | H10K 59/1213 |
| 2020/0075695 A1 | 3/2020 | Zhao et al. | |
| 2021/0320130 A1 | 10/2021 | Xian et al. | |

FOREIGN PATENT DOCUMENTS

| | | | |
|---|---|---|---|
| CN | 109148540 A | | 1/2019 |
| CN | 110211975 A | | 9/2019 |
| CN | 110728267 A | | 1/2020 |
| CN | 210348517 U | | 4/2020 |
| WO | WO9636903 | * | 11/1996 |
| WO | WO2019206079 | * | 10/2019 |

* cited by examiner

Vint 
600

Csa

Vint

DISPLAY SUBSTRATE INCLUDING LIGHT SHIELDING LAYER HAVING MULTIPLE IMAGING PINHOLES FORMED THEREIN AND METHOD FOR MANUFACTURING THE SAME, DISPLAY PANEL AND DISPLAY DEVICE

CROSS-REFERENCE TO RELATED APPLICATION

The present application is a U.S. national phase application of a PCT Application No. PCT/CN2020/121787 filed on Oct. 19, 2020, which claims a priority to Chinese patent application No. 201911117696.5, filed on Nov. 15, 2019, disclosures of which are incorporated herein by reference in their entireties.

TECHNICAL FIELD

The present disclosure relates to the field of display technology, and in particular, to a display substrate and a method for manufacturing the same, a display panel and a display device.

BACKGROUND

In the field of electronic equipment, especially in the field of mobile phones, it has become standard to equip biometrics, especially fingerprint recognition technique for identity authentication and other operations. Fingerprint recognition technique associates a person with his fingerprint, and verifies his true identity by comparing his fingerprint with pre-stored fingerprints. Humans have unique skin textures (including fingerprints) that are distinct from one another in terms of pattern, breakpoint and intersection. Relying on this uniqueness and stability, fingerprint recognition technique can be realized.

SUMMARY

The present disclosure provides a display substrate, including an array layer on a base substrate and a light shielding layer on a side of the array layer away from the base substrate, the array layer includes a driving transistor and a switching transistor, the switching transistor is a transistor connected to a gate electrode of the driving transistor, a plurality of imaging pinholes are formed in the light shielding layer, and a first orthographic projection of the imaging pinholes onto the base substrate and a second orthographic projection of an active layer pattern of the switching transistor in the array layer onto the base substrate do not overlap at least in part.

In an implementation, an orthographic projection of a channel region in an active layer pattern of a control transistor in the array layer onto the base substrate is a third orthographic projection, and an orthographic projection of a channel region in an active layer pattern of the driving transistor onto the base substrate is a fourth orthographic projection;

an orthographic projection of a channel region in the active layer pattern of the switching transistor onto the base substrate is a fifth orthographic projection;

a shortest distance between an edge of the first orthographic projection and the fifth orthographic projection is greater than a distance between the edge of the first orthographic projection and the third orthographic projection;

the shortest distance between the edge of the first orthographic projection and the fifth orthographic projection is greater than a distance between the edge of the first orthographic projection and the fourth orthographic projection;

the control transistor is a transistor in the array layer that is other than the switching transistor and the driving transistor.

In an implementation, the display substrate includes a first pixel region provided with an imaging pinhole and a second pixel region not provided with an imaging pinhole;

an area of the first pixel region is larger than an area of the second pixel region.

In an implementation, an aspect ratio of the switching transistor in the first pixel region is less than an aspect ratio of the switching transistor in the second pixel region.

In an implementation, the first orthographic projection and an orthographic projection of a metal pattern included in the array layer onto the base substrate do not overlap.

In an implementation, a diameter of each of the imaging pinholes is greater than or equal to 2 um, and less than or equal to 20 um.

In an implementation, a diameter of each of the imaging pinholes is greater than or equal to 4 um, and less than or equal to 7 um.

In an implementation, one imaging pinhole is provided within N pixel regions, wherein N is a positive integer greater than or equal to 3, and less than or equal to 10.

In an implementation, the array layer includes an active layer, a gate insulating layer, a first gate metal layer, a first insulating layer, a second gate metal layer, an interlayer dielectric layer, a first source-drain metal layer, and a second insulating layer that are sequentially provided between the base substrate and the light shielding layer; the display substrate further includes a planarization layer and an anode layer that are sequentially provided on a side of the light shielding layer away from the second insulating layer;

the light-shielding layer includes a light-shielding pattern and a connection pattern; the light-shielding pattern has the imaging pinholes; there is a light leakage gap between the light-shielding pattern and the connection pattern;

the first source-drain metal layer is electrically connected to the anode layer through a first via hole that penetrates the second insulating layer, the connection pattern, and a second via hole that penetrates the planarization layer;

an orthographic projection of the light leakage gap onto the base substrate is covered by an orthographic projection of a metal electrode included in the array layer onto the base substrate.

In an implementation, the array layer is a thin film transistor array layer.

In an implementation, the thin film transistor array layer includes the array layer and a second source-drain metal layer, and the second source-drain metal layer is reused as the light shielding layer.

In an implementation, the channel region of the active layer pattern of the driving transistor is of a zigzag shape, and the zigzag shape includes a plurality of first portions and a plurality of second portions, and the plurality of first portions are consecutively connected, with one of the plurality of second portions being connected between every two adjacent first portions, to form the zigzag shape.

The present disclosure further provides a method for manufacturing a display substrate, including:

forming an array layer on the base substrate; wherein the array layer includes a driving transistor and a switching transistor, and the switching transistor is a transistor connected to a gate electrode of the driving transistor;

forming a light-shielding layer on a side of the array layer away from the base substrate; forming a plurality of imaging pinholes in the light-shielding layer;

a first orthographic projection of the imaging pinholes onto the base substrate and a second orthographic projection of an active layer pattern of the switching transistor in the array layer onto the base substrate do not overlap at least in part.

In an implementation, the forming the array layer on the base substrate includes: sequentially providing an active layer, a gate insulating layer, a first gate metal layer, a first insulating layer, a second gate metal layer, an interlayer dielectric layer, a first source-drain metal layer, and a second insulating layer on the base substrate; and forming a first via hole that penetrates the second insulating layer;

the method for manufacturing the display substrate further includes:

forming a light-shielding pattern and a connection pattern on the light-shielding layer; the light-shielding pattern has the imaging pinholes; and there is a light leakage gap between the light-shielding pattern and the connection pattern;

Sequentially providing an planarization layer and an anode layer on a side of the light shielding layer away from the second insulating layer; forming a second via hole that penetrates the planarization layer;

the first source-drain metal layer is electrically connected to the anode layer through the first via hole, the connection pattern, and the second via hole;

an orthographic projection of the light leakage gap onto the base substrate is covered by an orthographic projection of a metal electrode included in the array layer onto the base substrate.

The present disclosure further provides a display panel, which includes the display substrate described above.

The present disclosure further provides a display device, which includes the display panel described above.

DETAILED DESCRIPTION

Figure 1:
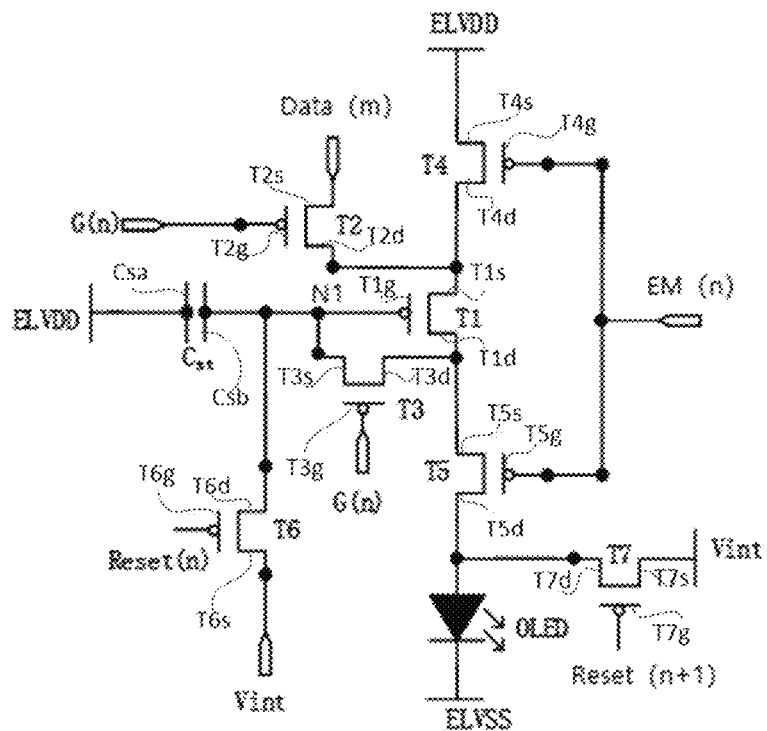
FIG. 1 is a circuit diagram of an example of a pixel driving circuit in a pixel.

Hereinafter, the technical solutions in embodiments of the present disclosure are described clearly in conjunction with drawings in the embodiments of the present disclosure. Apparently, the described embodiments are merely a part of embodiments of the present disclosure, rather than all the embodiments of the present disclosure. All other embodiments obtained by a person of ordinary skill in the art based on the described embodiments of the present disclosure, without creative efforts, shall fall within the scope of the present disclosure.

The transistors used in all the embodiments of the present disclosure may be triodes, thin film transistors or field effect transistors or other devices with the same characteristics. In the embodiment of the present disclosure, in order to distinguish two electrodes of the transistor other than the control electrode, one of the two electrodes is referred to as a first electrode and the other electrode is referred to as a second electrode.

In actual operation, when the transistor is a triode, the control electrode may be a base electrode, the first electrode may be a collector electrode, and the second electrode may be an emitter electrode; or the control electrode may be a base electrode, the first electrode may be an emitter electrode, and the second electrode may be a collector electrode.

In actual operation, when the transistor is a thin film transistor or a field effect transistor, the control electrode may be a gate electrode, the first electrode may be a drain electrode, and the second electrode may be a source electrode; or the control electrode may be a gate electrode, the first electrode may be a source electrode, and the second electrode may be a drain electrode.

Some embodiments of the present disclosure propose a solution to integrate fingerprint recognition function inside a display panel, the main principle of which is to use the self-luminous characteristic of OLED (organic light emitting diode) as a light source for fingerprint recognition, when light irradiates on a finger, the light reflected back by the finger is received by a fingerprint recognition device after passing through imaging pinholes provided in a back plate, and pattern information of the fingerprint can be obtained from composite analysis of images formed by all the imaging pinholes.

The manner of providing the fingerprint recognition device inside an OLED display panel increases the screen-to-body ratio, but the display uniformity and display grayscale accuracy of the display panel integrating the fingerprint recognition device degrade. After analysis, it is found that because of the light-admitting design of the imaging pinholes, the light reflected by the fingerprint affects the circuit structure in the back plate, especially the TFT (Thin Film Transistor) device structure, resulting in the deterioration of the TFT device structure, which in turn causes the degradation of display uniformity and grayscale accuracy.

Some embodiments of the present disclosure further provide a display substrate, a manufacturing method thereof, a display panel and a display device, to solve the problem in the display panel integrating the fingerprint recognition device that the light reflected by the fingerprint affects the circuit structure in the back plate, especially the TFT (Thin Film Transistor) device structure, resulting in the deterioration of the TFT device structure, which in turn causes the degradation of display uniformity and grayscale accuracy.

Figure 12:
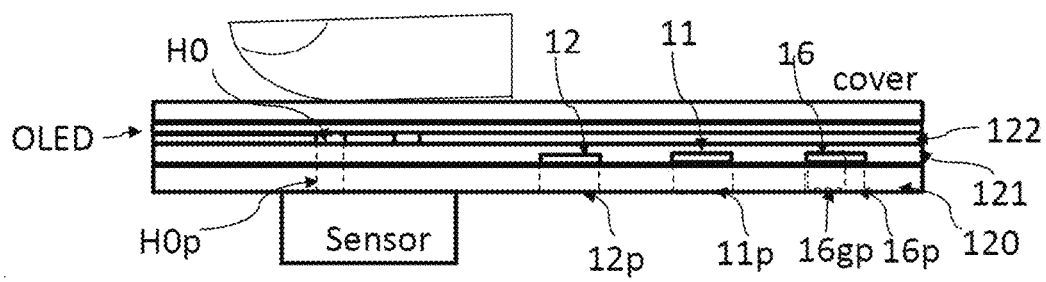
FIG. 12 is a schematic sectional diagram of a display substrate according to an embodiment of the present disclosure.

As shown in FIG. 12, the display substrate according to an embodiment of the present disclosure includes an array layer 121 on a base substrate 120 and a light shielding layer 122 on a side of the array layer 121 away from the base substrate 120, wherein the array layer includes a driving transistor and a switching transistor, the switching transistor is a transistor connected to a gate electrode of the driving transistor, a plurality of imaging pinholes H0 are formed in the light shielding layer 122, and a first orthographic projection H0$p$ of the imaging pinholes H0 onto the base substrate and a second orthographic projection 16$p$ of an active layer pattern 16 of the switching transistor in the array layer onto the base substrate do not overlap at least in part.

In some embodiments, a first orthographic projection of the imaging pinholes onto the base substrate and a second orthographic projection of an active layer pattern of the switching transistor in the array layer onto the base substrate do not overlap at least in part, for example, it may be that 99% of the first orthographic projection does not overlap with the second orthographic projection, that is, only 1% of the first orthographic projection overlaps with the second orthographic projection.

In some embodiments, it may also be that the first orthographic projection and the second orthographic projection do not overlap at all.

In the display panel according to the embodiment of the present disclosure, the imaging pinholes formed in the light shielding layer are set to not correspond to the active layer pattern of the switching transistor in the array layer, so that the light passing through the imaging pinholes will not affect the active layer pattern of the switching transistor, and the switching transistor will not have photo-generated leakage current in the off state due to the irradiation of light, thereby not affecting the potential of the gate of the driving transistor, and avoiding the problem of inaccurate display grayscale.

In the embodiments of the present disclosure, that the first orthographic projection and the second orthographic projection do not overlap at all means that there is no overlapping part between the first orthographic projection and the second orthographic projection, but the present disclosure is not limited to this.

According to a specific implementation, the array layer may be a thin film transistor array layer, but the present disclosure is not limited to this.

According to another specific implementation, the thin film transistor array layer may include the array layer and a second source-drain metal layer, and the second source-drain metal layer is reused as the light shielding layer, but the present disclosure is not limited to this.

Specifically, an orthographic projection of a channel region in an active layer pattern 12 of a control transistor in the array layer onto the base substrate is a third orthographic projection 12$p$, and an orthographic projection of a channel region in an active layer pattern 11 of the driving transistor onto the base substrate is a fourth orthographic projection 11$p$;

an orthographic projection of a channel region in the active layer pattern of the switching transistor onto the base substrate is a fifth orthographic projection 16$gp$;

a shortest distance between an edge of the first orthographic projection H0$p$ and the fifth orthographic projection 16$gp$ is greater than a distance between the edge of the first orthographic projection H0$p$ and the third orthographic projection 12$p$;

the shortest distance between the edge of the first orthographic projection H0$p$ and the fifth orthographic projection 16$gp$ is greater than a distance between the edge of the first orthographic projection H0$p$ and the fourth orthographic projection 11$p$;

the control transistor is a transistor in the array layer that is other than the switching transistor and the driving transistor.

In a specific implementation, the shortest distance between an edge of the first orthographic projection and the fifth orthographic projection is greater than a distance between the edge of the first orthographic projection and the third orthographic projection, the shortest distance between the edge of the first orthographic projection and the fifth orthographic projection is greater than a distance between the edge of the first orthographic projection and the fourth orthographic projection, such that the imaging pinholes are far away from the channel region of the active layer pattern of the switching transistor, to prevent the channel region of the active layer pattern of the switching transistor from being irradiated by light passing through the imaging pinholes.

Specifically, the display substrate may include a first pixel region P1 provided with an imaging pinhole and a second pixel region P2 not provided with an imaging pinhole;

an area of the first pixel region is larger than an area of the second pixel region.

In an optional case, an aspect ratio of the switching transistor in the first pixel region may be less than an aspect ratio of the switching transistor in the second pixel region, so as to reduce a current value of the photo-generated leakage current, thereby increasing the display grayscale accuracy, but the present disclosure is not limited to this.

In a specific implementation, the first orthographic projection and an orthographic projection of a metal pattern included in the array layer onto the base substrate do not overlap.

Further, it is necessary that the imaging pinholes are not blocked by the metal pattern, so as to improve the accuracy of the pinhole-imaging based fingerprint recognition.

In the embodiments of the present disclosure, a diameter of the imaging pinhole may be greater than or equal to 2 um, and less than or equal to 20 uml, but the present disclosure is not limited to this.

In an optional case, a diameter of the imaging pinhole may be greater than or equal to 4 um, and less than or equal to 7 um, but the present disclosure is not limited to this.

In a specific implementation, in the display substrate of the embodiment of the present disclosure, the density of the imaging pinholes can be flexibly adjusted according to the actual situation. One imaging pinhole may be provided within N pixel regions, where N is a positive integer.

In an optional case, N may be greater than or equal to 3, and less than or equal to 10, but the present disclosure is not limited to this.

Specifically, the array layer may include an active layer, a gate insulating layer, a first gate metal layer, a first insulating layer, a second gate metal layer, an interlayer dielectric layer, a first source-drain metal layer, and a second insulating layer that are sequentially provided between the base substrate and the light shielding layer; the display substrate further includes a planarization layer and an anode layer that are sequentially provided on a side of the light shielding layer away from the second insulating layer;

the light-shielding layer includes a light-shielding pattern and a connection pattern; the light-shielding pattern has the imaging pinholes;

the first source-drain metal layer is electrically connected to the anode layer through a first via hole that penetrates the second insulating layer, the connection pattern, and a second via hole that penetrates the planarization layer; there is a light leakage gap between the light-shielding pattern and the connection pattern;

an orthographic projection of the light leakage gap onto the base substrate is covered by an orthographic projection of a metal electrode included in the array layer onto the base substrate.

In a specific implementation, the light-shielding pattern and the connection pattern are separated from each other, and the light-shielding pattern and the connection pattern are insulated from each other.

In a specific implementation, the display substrate according to the embodiment of the present disclosure may include a base substrate, an array layer, a light-shielding layer, an planarization layer, and an anode layer that are sequentially disposed from bottom to top;

the array layer may include an active layer, a gate insulating layer, a first gate metal layer, a first insulating layer, a second gate metal layer, an interlayer dielectric layer, a first source-drain metal layer, and a second insulation layer that are disposed from bottom to top.

In actual operation, the anode layer needs to be electrically connected to the first source-drain metal layer. Therefore, the light-shielding layer is provided with a connection pattern separated from the light-shielding pattern, so that the first source-drain metal layer is electrically connected to the anode layer through the first via hole that penetrates the second insulating layer, the connection pattern, and the second via hole that penetrates the planarization layer;

moreover, since the light-shielding pattern and the connection pattern are insulated from each other, there is a light leakage gap between the light-shielding pattern and the connection pattern; the light leakage gap may leak light, so it is arranged that the orthographic projection of the light leakage gap onto the base substrate is covered by the orthographic projection of the metal electrode included in the array layer onto the base substrate, so as to prevent the light leaked through the light leakage gap from affecting the pinhole-imaging based fingerprint recognition.

The metal electrode may be, for example, an upper plate of a storage capacitor, but the present disclosure is not limited to this.

FIG. 1 is a circuit diagram of an example of a pixel driving circuit in a pixel.

As shown in FIG. 1, an example of the pixel driving circuit may include a driving transistor T1, a first switching transistor T3, a second switching transistor T6, a first control transistor T2, a second control transistor T4, a third control transistor T5, a fourth control transistor T7 and a storage capacitor Cst;

a source electrode T3s of the first switching transistor T3 is electrically connected to a gate electrode T1g of the driving transistor T1, and a drain electrode T3d of the first switching transistor T3 is electrically connected to a drain electrode T1d of the driving transistor T1;

a gate electrode T3g of the first switching transistor T3 is electrically connected to the n-th row gate line G(n);

a gate electrode T6g of the second switching transistor T6 is electrically connected to the n-th row reset line Reset(n), a drain electrode T6d of the second switching transistor T6 is electrically connected to a gate electrode T1g of the driving transistor T1, and a source electrode T6s of the second switching transistor T6 is electrically connected to the initial voltage line Vint;

a gate electrode T2g of the first control transistor T2 is electrically connected to the n-th row gate line G(n), and a source electrode T2s of the first control transistor T2 is electrically connected to the m-th column data line Data(m), a drain electrode T2d of the first control transistor T2 is electrically connected to a source electrode T1s of the driving transistor T1;

a gate electrode T4g of the second control transistor T4 is electrically connected to the n-th row light-emitting control line EM(n), a source electrode T4s of the second control transistor T4 is electrically connected to a power supply voltage line ELVDD, and a drain electrode T4d of the second control transistor T4 is electrically connected to a source electrode T1s of the driving transistor T1;

a gate electrode T5g of the third control transistor T5 is electrically connected to the n-th row of light-emitting control line EM(n), and a source electrode T5s of the third control transistor T5 is electrically connected to a drain electrode T1d of the driving transistor T1, a drain electrode T5s of the third control transistor T5 is electrically connected to the anode of the organic light emitting diode OLED; the cathode of the organic light emitting diode OLED is electrically connected to the low voltage line ELVSS;

a gate electrode T7g of the fourth control transistor T7 is electrically connected to the (n+1)-th row reset line Reset (n+1), a drain electrode T7d of the fourth control transistor T7 is electrically connected to the anode of the organic light emitting diode OLED, and a source electrode T7s of the fourth control transistor T7 is electrically connected to the initial voltage line Vint;

a first plate Csa of the storage capacitor Cst is electrically connected to the power supply voltage line ELVDD, and a gate electrode T1g of the driving transistor T1 may be reused as a second plate Csb of the storage capacitor Cst;

wherein, n is a positive integer, and m is a positive integer.

The example of the pixel driving circuit as shown in FIG. 1 may be a pixel driving circuit in the pixel region at the n-th row and the m-th column, but the present disclosure is not limited to this.

In the example of the pixel driving circuit as shown in FIG. 1, all the transistors are p-type thin film transistors, but the present disclosure is not limited to this.

In FIG. 1, the first node N1 is a node electrically connected to the gate electrode of T1.

The pixel driving circuit shown in FIG. 1 is only an example of the pixel driving circuit in the pixel, and does not limit the structure of the pixel driving circuit.

In embodiments of the present disclosure, T6 may be a double-gate transistor to reduce its leakage current and adequately maintain the potential of the gate electrode of T1, but the present disclosure is not limited to this.

Figure 2:
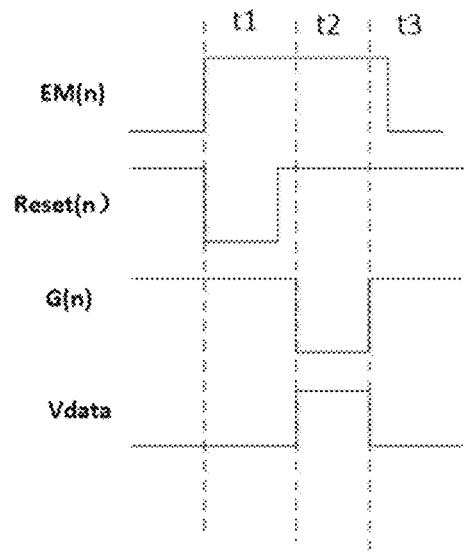
FIG. 2 is an operating timing diagram of the example of the pixel driving circuit shown in FIG. 1.

FIG. 2 is an operating timing diagram of the example of the pixel driving circuit shown in FIG. 1, in which t1 is a first stage, t2 is a second stage, t3 is a third stage, and the data voltage provided by the data line Data(n) the data voltage is labeled as Vdata.

As shown in FIG. 2, when the example of the pixel driving circuit shown in FIG. 1 is in operation, in the first stage t1 (i.e. a reset stage), Reset(n) inputs a low electrical level, G(n) inputs a high electrical level, EM(n) inputs a high electrical level, T6 is on, and the potential of the gate electrode of T1 is reset to the initial voltage;

in the second stage t2 (i.e., a data writing and threshold voltage compensation stage), Reset (n) inputs a high electrical level, G (n) inputs a low electrical level, Data (m) inputs a data voltage Vdata, EM (n) inputs a high electrical level, T6 is off, T4 and T5 are off, T2, T3, T1 and T7 are on, Vdata charges Cst through T2, T1, and T3 to increase the potential of the gate electrode of T1 until the potential of the gate electrode of T1 changes to Vdata+Vth (Vth is the threshold voltage of T1), at this time, T3 is turned off, the potential of N1 is stored by Cst, meanwhile T7 is turned on to reset the potential of the anode of the OLED to the initial voltage;

in the third stage t3 (i.e., a light-emitting stage), Reset (n) inputs a high electrical level, G (n) inputs a high electrical level, EM (n) inputs a low electrical level, and T1, T2, T3, T6 and T7 are off, T4 and T5 are turned on, OLED emits light, and the driving current I of T1 for driving OLED to emit light is equal to $(\frac{1}{2})K(Vdata-Vdd)^2$; wherein K is the current coefficient and Vdd is the voltage value of the power supply voltage input by ELVDD.

In the example of the pixel drive circuit shown in FIG. 1, the source electrode T3s of T3 is electrically connected to the gate electrode T1g of T1, and the drain electrode T6d of T6 is electrically connected to the gate electrode T1g of T1. If light irradiates on T3 and T6, it may cause the occurrence of photo-generated leakage currents in T3 and T6 even in off state, which in turn affects the potential of the gate electrode T1g of the driving transistor T1, resulting in inaccurate display grayscale. In view of this, the embodiment of the present disclosure provides a display substrate integrating a pinhole imaging function, to optimize the position and manner in which to arrange the imaging pinholes, and reduce impact of the imaging pinholes on display quality and display accuracy while ensuring the accuracy of the pinhole-imaging based fingerprint recognition.

In a specific implementation, the display substrate can be separately provided with a specific fingerprint recognition area, or the entire screen can be a fingerprint recognition area.

In an embodiment of the present disclosure, the display substrate may include a base substrate, a buffer layer, an array layer, a second source-drain metal layer, a planarization layer, an anode layer, a pixel defining layer, a light emitting layer, and a cathode layer which are disposed from bottom to top. The array layer includes an active layer, a gate insulating layer, a first gate metal layer, a first insulating layer, a second gate metal layer, an interlayer dielectric layer, a first source-drain metal layer, and a second insulation layer that are disposed from bottom to top; wherein, the first gate metal layer is used to form structures such as gate lines, light-emitting control lines, and gate electrodes of various transistors in the pixel driving circuit;

the second gate metal layer is used to form the plates of the storage capacitor and the initial voltage line;

the first source-drain metal layer is used to form structures such as data lines, the power supply voltage lines, the source electrodes of various transistors in the pixel driving circuit, and the drain electrodes of various transistors in the pixel driving circuit;

the second source-drain metal layer is reused as a light shielding layer, and imaging pinholes are formed in the light shielding layer.

In a specific implementation, since the anode layer needs to be electrically connected to the first source-drain metal layer to complete the circuit structure, it is necessary to further provide the second source-drain metal layer (that is, the light shielding layer) with a connection pattern, and the first source-drain metal layer is electrically connected to the anode layer through a first via hole that penetrates the second insulating layer, the connection pattern, and a second via hole that penetrates the planarization layer.

In the embodiment of the present disclosure, the active layer pattern may include, for example, a channel region, a source electrode region, and a drain electrode region. The channel region may not be doped with impurities, so it has semiconductor characteristics. The source electrode region is disposed on a first side of the channel region, and the drain electrode region is disposed on a second side of the channel region. The first side and the second side are opposite sides and are doped with impurities, and therefore have conductivity. Impurities may vary depending on whether the transistor is an n-type transistor or a p-type transistor.

The doped source electrode region may correspond to the source electrode of the transistor, and the doped drain electrode region may correspond to the drain electrode of the transistor.

Figure 3:
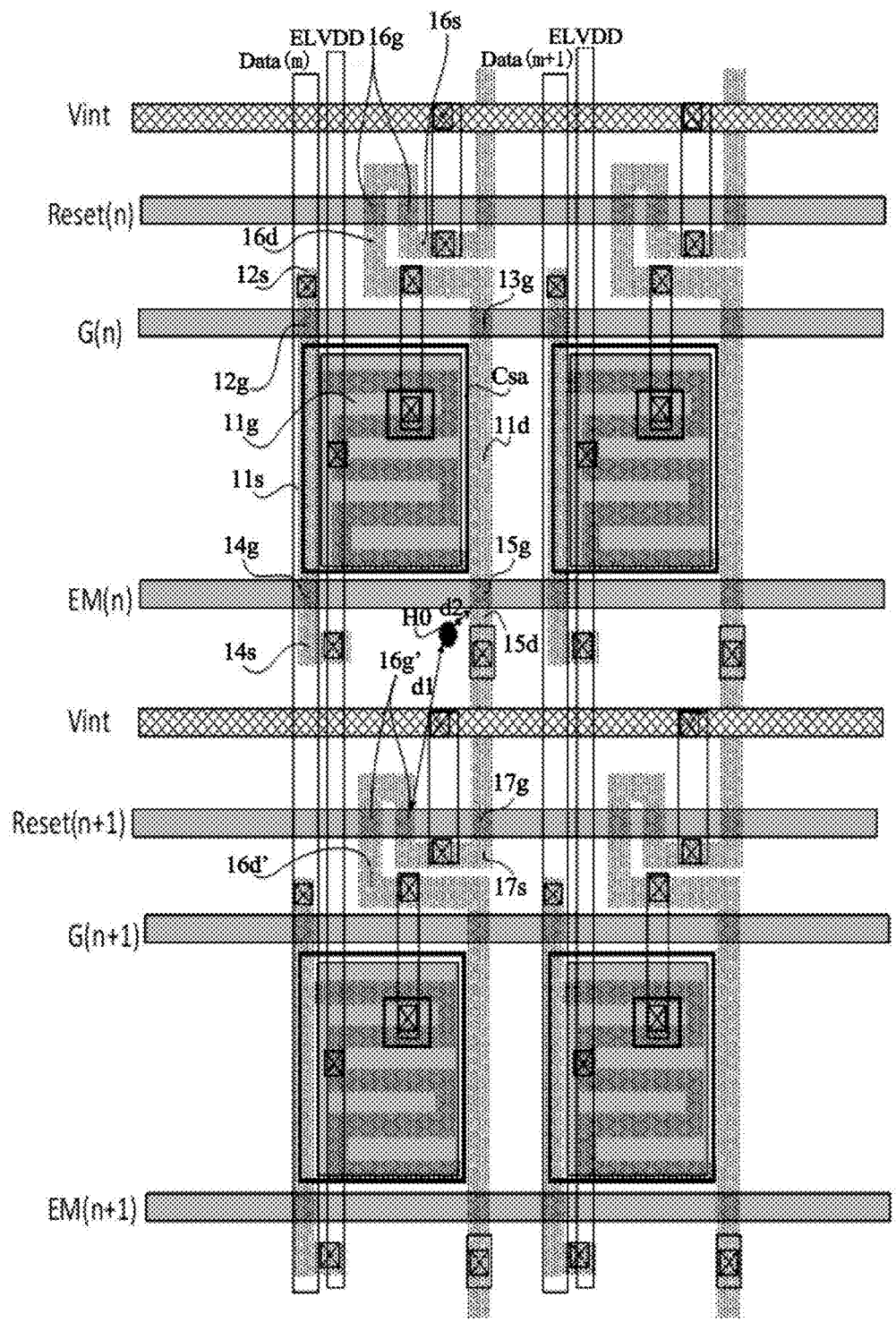
FIG. 3 is a schematic diagram of a layout implementation of transistors and storage capacitors in a display substrate according to an embodiment of the present disclosure.

FIG. 3 is a schematic diagram of a layout implementation of transistors and storage capacitors in a display substrate according to an embodiment of the present disclosure. FIG. 3 is composed of an active layer 400, a first gate metal layer 500, a second gate metal layer 600, and a first source-drain metal layer 700 from bottom to top.

Figure 4:
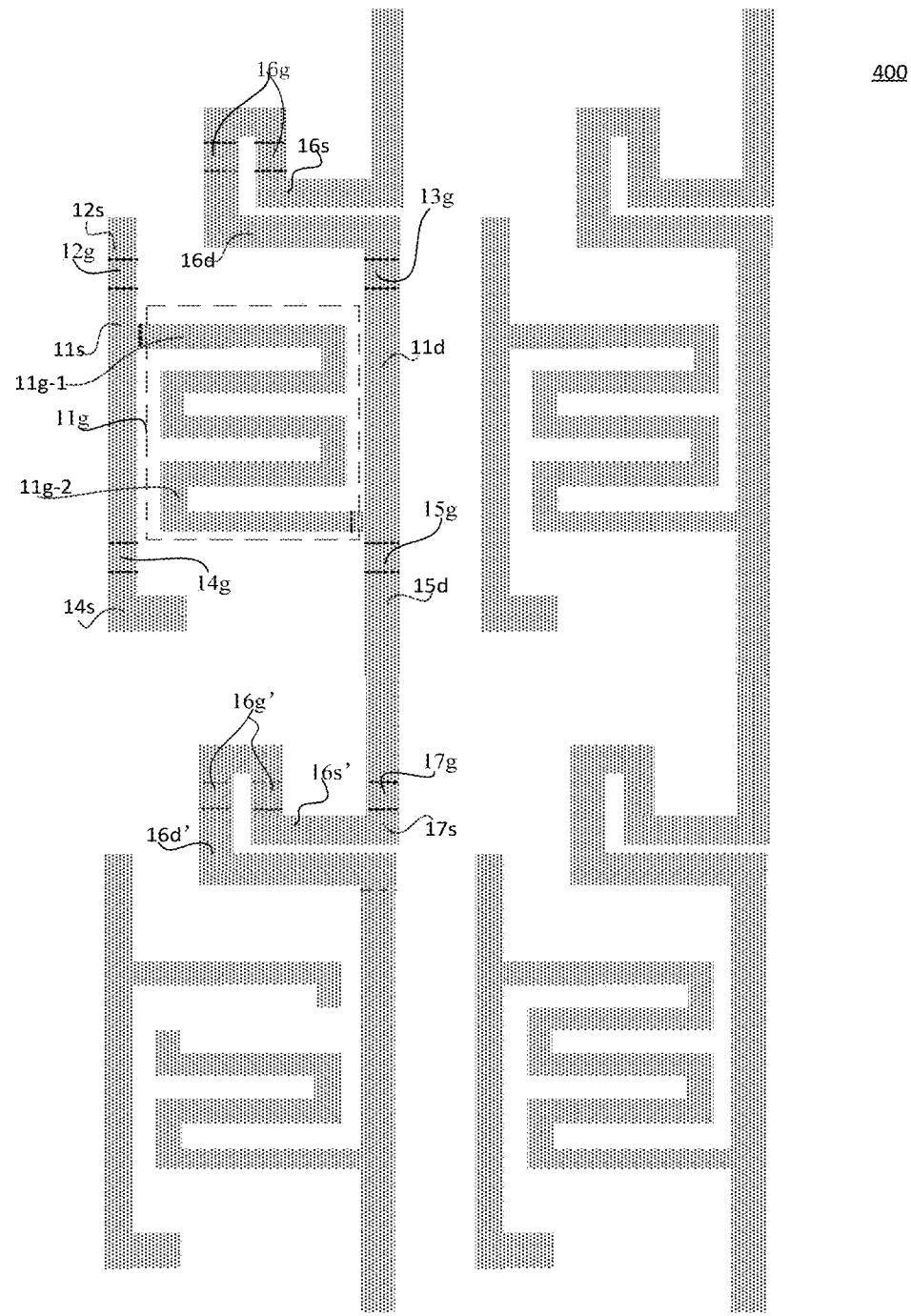
FIG. 4 is a schematic diagram of the active layer in FIG. 3.
Figure 5:
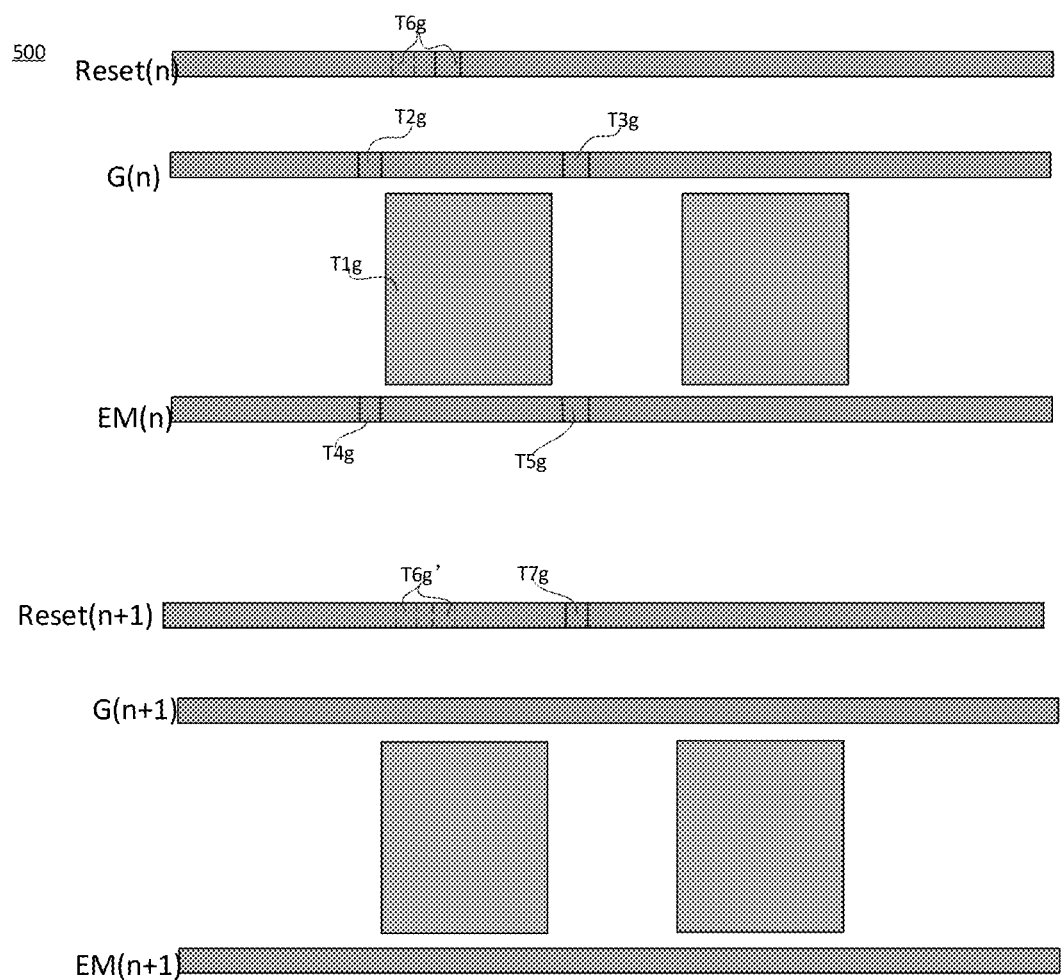
FIG. 5 is a schematic diagram of the first gate metal layer in FIG. 3.
Figure 6:
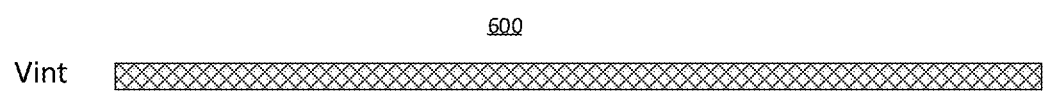
FIG. 6 is a schematic diagram of the second gate metal layer in FIG. 3.
Figure 6:
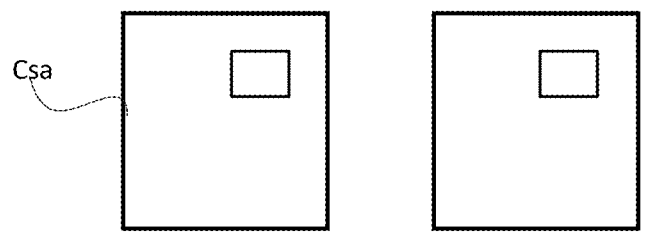
Figure 6:
Figure 6:
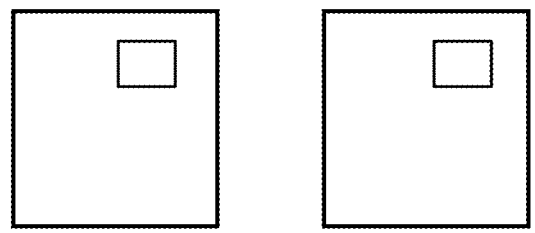
Figure 7:
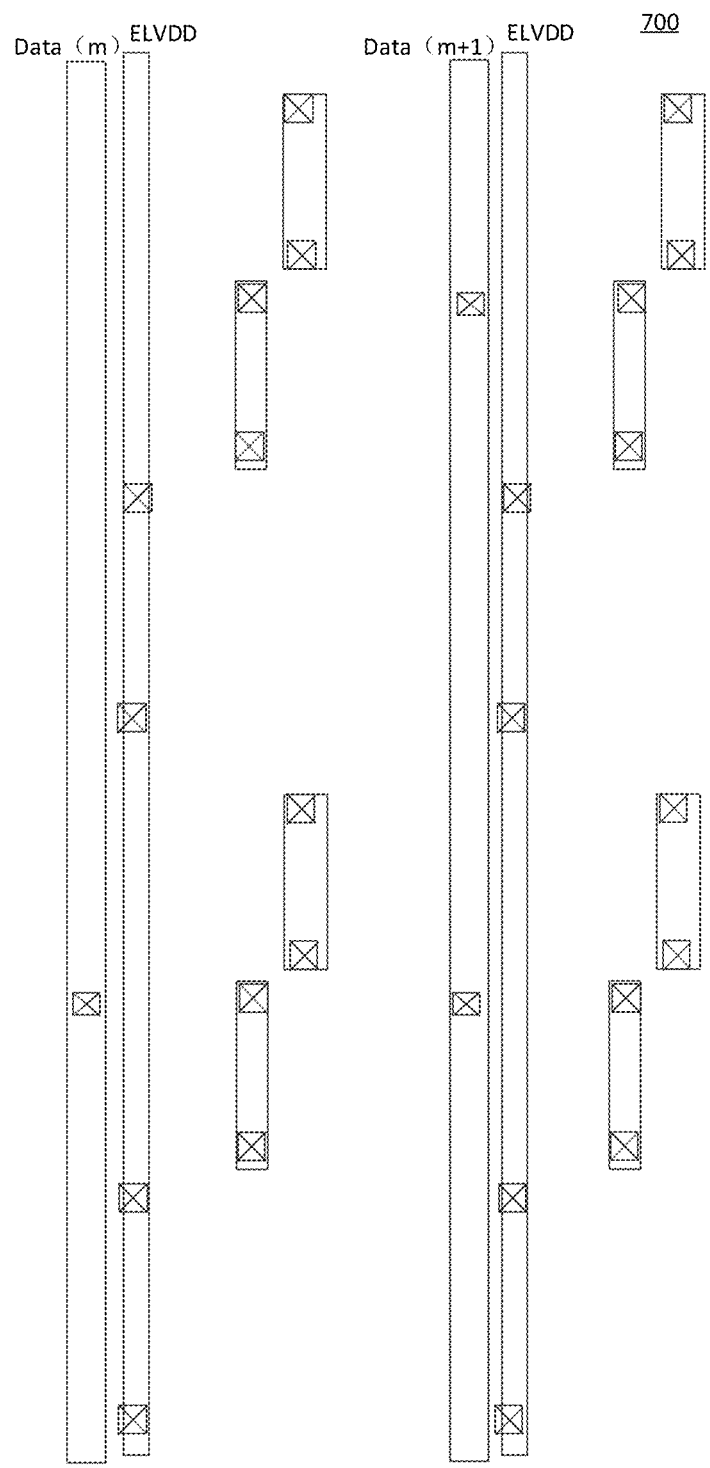
FIG. 7 is a schematic diagram of the first source-drain metal layer in FIG. 3.

FIG. 4 is a schematic diagram of the active layer 400 in FIG. 3, FIG. 5 is a schematic diagram of the first gate metal layer 500 in FIG. 3, FIG. 6 is a schematic diagram of the second gate metal layer 600 in FIG. 3, and FIG. 7 is a schematic diagram of the first source-drain metal layer 700 in FIG. 3.

In FIGS. 3 to 7, the reference numeral Data(m) denotes the m-th column data line, the reference numeral Data(m+1) denotes the (m+1)-th column data line, and the reference numeral ELVDD denotes the power supply voltage line, the reference numeral Vint denotes the initial voltage line, the reference numeral Reset(n) denotes the n-th row reset line, the reference numeral Reset(n+1) denotes the (n+1)-th row reset line, and the reference numeral EM(n) denotes the n-th row light-emitting control line, the reference numeral EM(n+1) denotes the (n+1)-th row light-emitting control line, the reference numeral G(n) denotes the n-th row gate line, and the reference numeral G(n+1) denotes the (n+1)-th row gate line.

In FIGS. 3 to 7, the reference numeral 16g denotes the channel region of the active layer pattern of T6, the reference numeral 16s denotes the source electrode region of the active layer pattern of T6, the reference numeral 16d denotes the drain electrode region of the active layer pattern of T6, the reference numeral 13g denotes the channel region of the active layer pattern of T3, the reference numeral 11g denotes the channel region of the active layer pattern of T1, the reference numeral 11d denotes the drain electrode region of the active layer pattern of T1, the reference numeral 11s denotes the source electrode region of the active layer pattern of T1; the reference numeral 12g denotes the channel region of the active layer pattern of T2, the reference numeral 12s denotes the source electrode region of the active layer pattern of T2, the reference numeral 14g denotes the channel region of the active layer pattern of T4, the reference numeral 14s denotes the source electrode region of the active layer pattern of T4, the reference numeral 15g denotes the channel region of the active layer pattern of T5, the reference numeral 15d denotes the drain electrode region of the active layer pattern of T5, the reference numeral 17g denotes the channel region of the active layer pattern of T7, the reference numeral 17s denotes the source electrode region of the active layer pattern of T7, the reference numeral Csa denotes the first plate of the storage capacitor Cst, the reference numeral 16g' denotes the channel region of the active layer pattern of the second switching transistor in the pixel region at the (n+1)-th row and m-th column, and the reference numeral 16d' denotes the drain electrode region of the active layer pattern of the second switching transistor in the pixel region at the (n+1)-th row and the m-th column.

In FIG. 3, the reference numeral H0 denotes the imaging pinhole, the orthographic projection of H0 onto the base substrate does not overlap with the orthographic projection of the active layer pattern of T3 onto the base substrate, and the orthographic projection of H0 onto the base substrate does not overlap with the orthographic projection of the active layer pattern of T6 onto the base substrate, and the orthographic projection of H0 onto the base substrate does not overlap with the active layer pattern of the second switching transistor in the pixel region at the (n+1)-th row and m-th column, so that the active layer pattern of T3, the active layer pattern of T6, and the active layer pattern of the second switching transistor in the pixel region at the (n+1)-th row and m-th column are not irradiated by the light passing through the imaging pinhole H0, to avoid the occurrence of photo-generated leakage current in each switching transistor in off state as a result of the irradiation of light, thereby not affecting the potential of the gate electrode of T1, and avoiding the problem of inaccurate display grayscale.

In FIG. 3, the distance d1 between the edge of the orthographic projection of H0 onto the base substrate and 16g' is greater than the distance d2 between the edge of the orthographic projection of H0 onto the base substrate and 15g.

In the embodiment shown in FIG. 3, the shortest distance between the edge of the orthographic projection of H0 onto the base substrate and the orthographic projection of the channel region in the active layer pattern of T3 onto the base substrate is greater than the distance between the edge of the orthographic projection of H0 onto the base substrate and the orthographic projection of the channel region in the active layer pattern of any transistor (such as T1, T2, T5, etc.) in the pixel circuit other than T3 and T6 onto the base substrate; the shortest distance between the edge of the orthographic projection of H0 onto the base substrate and the orthographic projection of the channel region in the active layer pattern of T6 onto the base substrate is greater than the distance between the edge of the orthographic projection of H0 onto the base substrate and the orthographic projection of the channel region in the active layer pattern of any transistor in the pixel circuit other than T3 and T6 onto the base substrate.

In FIG. 3, the orthographic projection of H0 onto the base substrate does not overlap with the orthographic projections of the metal patterns included in the array layer, such as the first gate metal layer, the second gate metal layer, and the first source-drain metal layer, onto the base substrate.

It is necessary that the imaging pinhole H0 is not blocked by the metal pattern to improve the accuracy of the pinhole-imaging based fingerprint recognition.

In some embodiments, a diameter of the imaging pinhole H0 may be greater than or equal to 2 um, and less than or equal to 20 uml. Optionally, a diameter of the imaging pinhole H0 may be greater than or equal to 4 um, and less than or equal to 7 um.

In the layout implementation of the transistors and storage capacitors in the display substrate according to the embodiment of the present disclosure as shown in FIG. 3, 11d is connected to the source electrode region in the active layer pattern of T5, 15d is connected to drain electrode region in the active layer pattern of T7, 16d is connected to the source electrode region of the active layer pattern of T3, 11s is connected to the drain electrode region of the active layer pattern of T4, 11d is connected to the drain electrode region of the active layer pattern of T5, and 11s is connected to the drain electrode region of the active layer pattern of T2.

In some embodiments, the channel region of the active layer pattern of the driving transistor is of a zigzag shape, and the zigzag shape includes a plurality of first portions and a plurality of second portions, and the plurality of first portions are consecutively connected, with one of the plurality of second portions being connected between every two adjacent first portions, to form the zigzag shape.

For example, as shown in FIG. 4, the channel region 11g of the active layer pattern of the driving transistor T1 is of a zigzag shape, or in other words, is tortuous. The zigzag shape includes a plurality of first portions 11g-1 and a plurality of second portions 11g-2, a tail of a first first portion 11g-1 and a head of a second first portion 11g-1 is connected through a second portion 11g-2, and a tail of a third first portion 11g-1 and a head of a fourth first portion 11g-1 is connected through a second portion 11g-2, . . . , and so on, to form the zigzag shape.

In FIG. 5, the reference numeral Tog' denotes the gate electrode of the second switching transistor in the pixel region at the (n+1)-th row and the m-th column.

In FIG. 5, the reference numeral T1g denotes the gate electrode of T1, the reference numeral T2g denotes the gate electrode of T2, the reference numeral T3g denotes the gate electrode of T3, the reference numeral T4g denotes the gate electrode of T4, the reference numeral T5g denotes the gate electrode of T5, the reference numeral T6g denotes the gate electrode of T6, the reference numeral T7g denotes the gate electrode of T7.

In FIGS. 3 and 7, the crosses enclosed by the boxes denote the vias.

In FIG. 7, the vertical bars are connecting lines, except for the data lines and the power supply voltage lines.

The display substrate according to the embodiment of the present disclosure optimizes the position design of the imaging pinholes, and while ensuring the accuracy of the pinhole-imaging based fingerprint recognition, reduces impact of the imaging pinholes on display quality, especially display accuracy, thereby improving the display quality.

Figure 8:
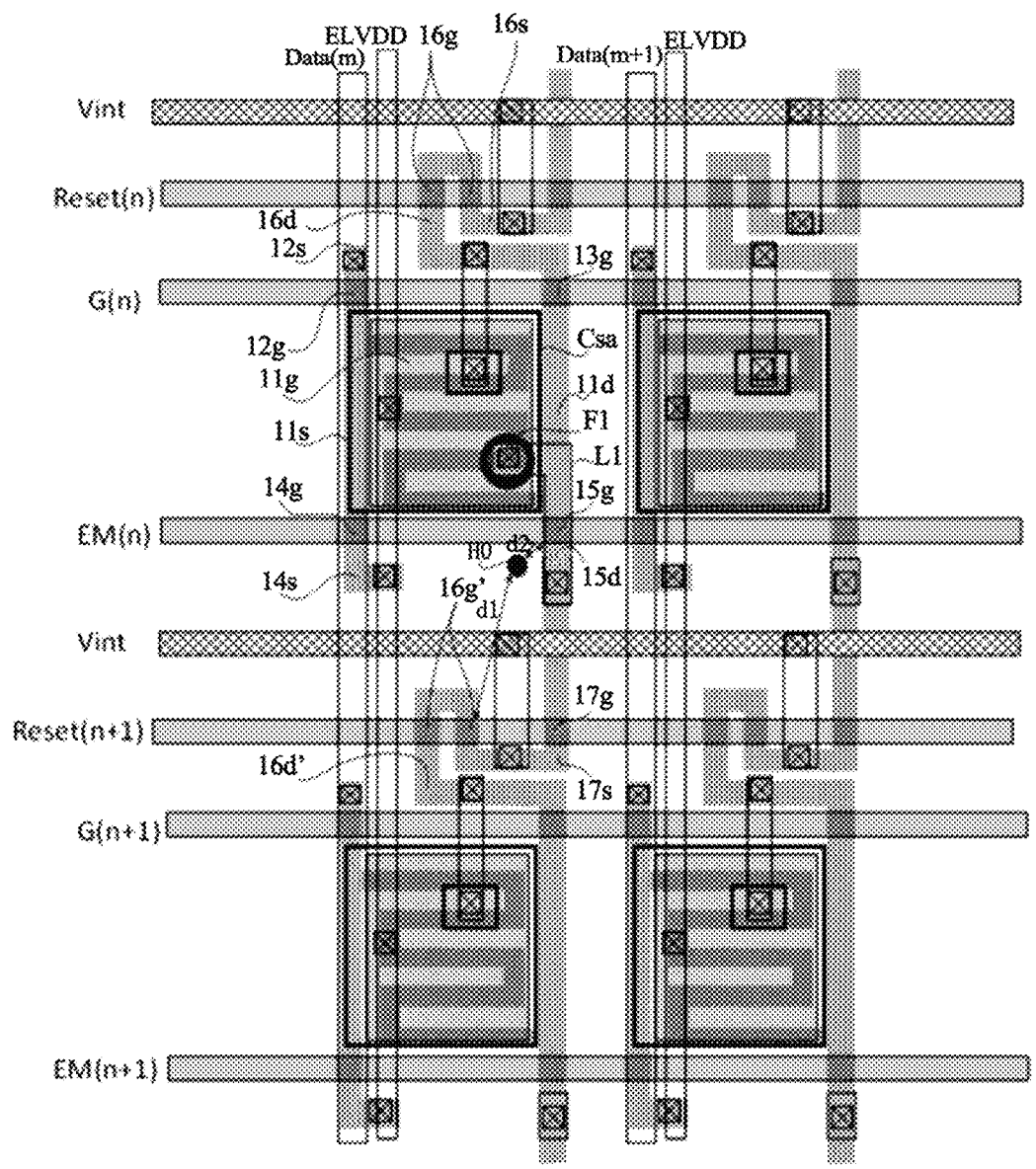
FIG. 8 is a schematic diagram of a layout implementation in which a second source-drain metal layer is added on the basis of FIG. 3.
Figure 9:
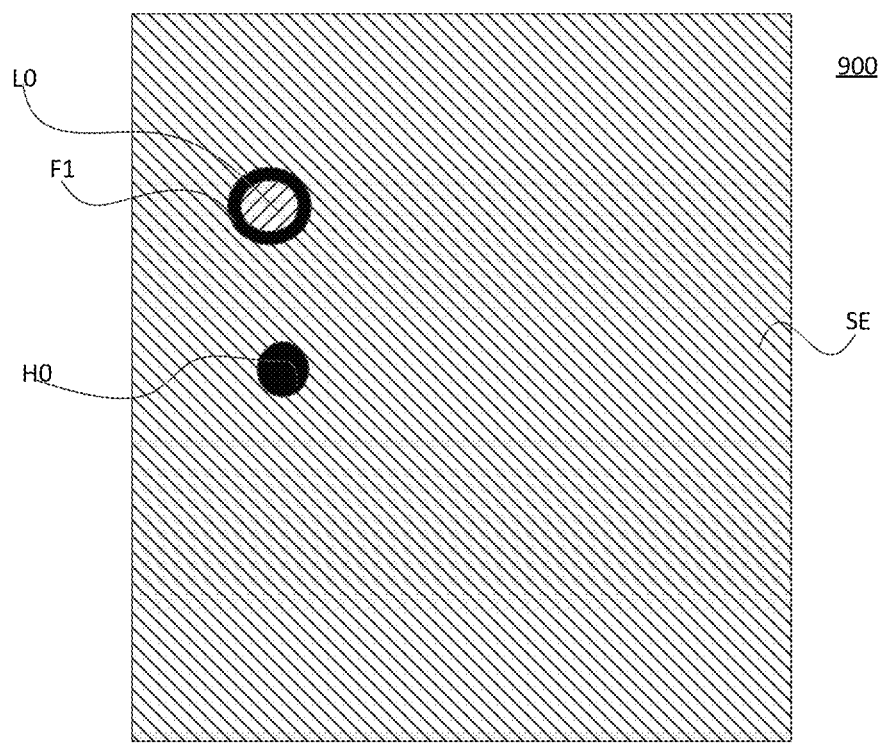
FIG. 9 is a schematic diagram of the second source-drain metal layer in FIG. 8.

As shown in FIG. 8, a second source-drain metal layer is added on the basis of the schematic diagram of the layout implementation shown in FIG. 3; in FIG. 8, the reference numeral F1 denotes the light leakage gap, and the reference numeral L1 denotes the connection pattern included in the first source-drain metal layer; FIG. 9 shows the second source-drain metal layer 900 in FIG. 8. In FIG. 9, the reference numeral L0 denotes the connection pattern included in the second source-drain metal layer; the reference numeral SE denotes the light-shielding pattern included in the second source-drain metal layer 900, the reference numeral H0 denotes the imaging pinhole, and the reference numeral F1 denotes the light leakage gap;

the connection pattern L1 included in the first source-drain metal layer is used for electrical connection between the drain electrode of T5 and the connection pattern L0 included in the second source-drain metal layer;

the connection pattern L0 included in the second source-drain metal layer is used for electrical connection between the connection pattern L1 included in the second source-drain metal layer and the anode layer.

Figure 10:
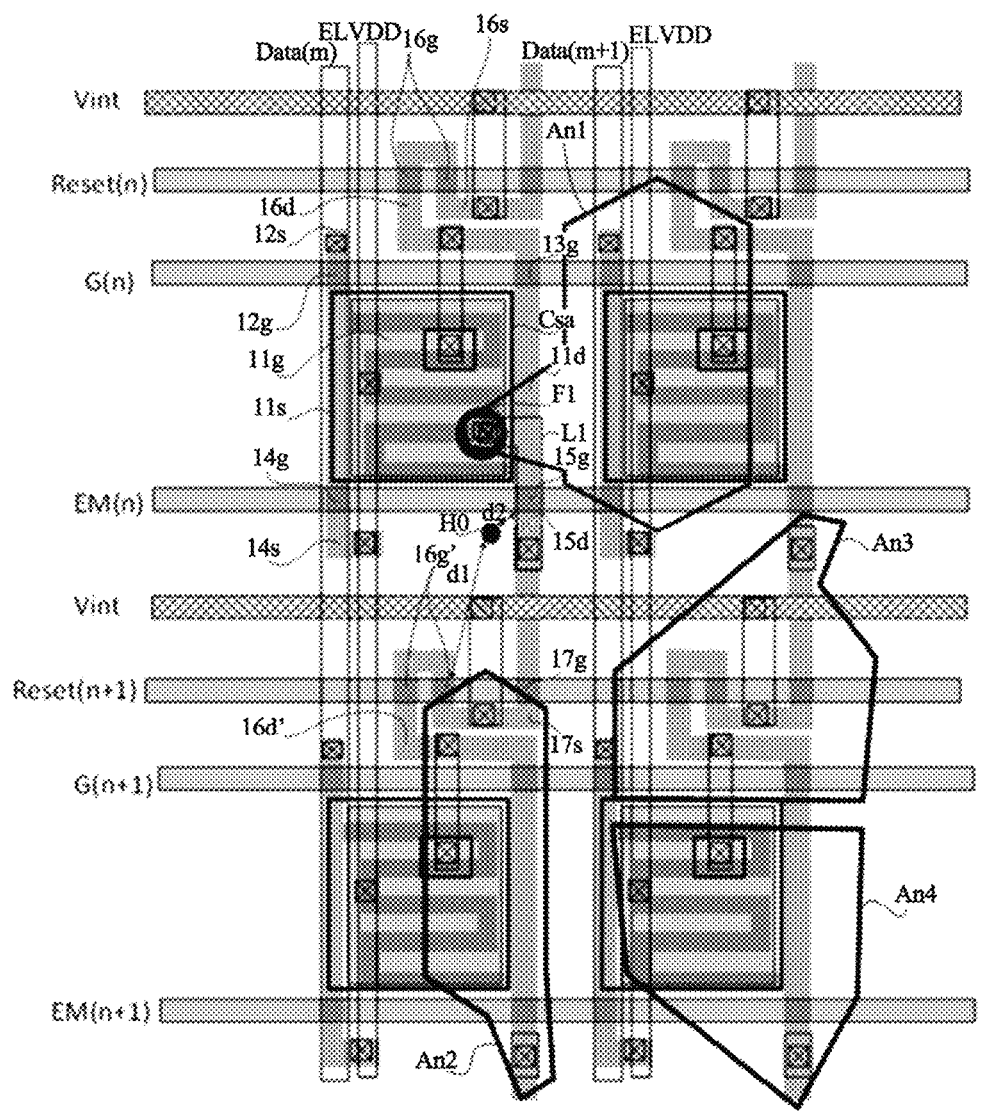
FIG. 10 is a schematic diagram of a layout implementation in which an anode layer is added on the basis of FIG. 8.

As shown in FIG. 10, an anode layer is added on the basis of the schematic diagram of the layout implementation shown in FIG. 8. In FIG. 10, the reference numeral An1 denotes a first anode included in the anode layer, and the reference numeral An2 denotes a second anode included in the anode layer, the reference numeral An3 denotes a third anode included in the anode layer, and the reference numeral An4 denotes a fourth anode included in the anode layer;

the first anode An1 included in the anode layer is electrically connected to the drain electrode of T5 through the connection pattern L0 included in the second source-drain metal layer and the connection pattern L1 included in the first source-drain metal layer.

Figure 11:
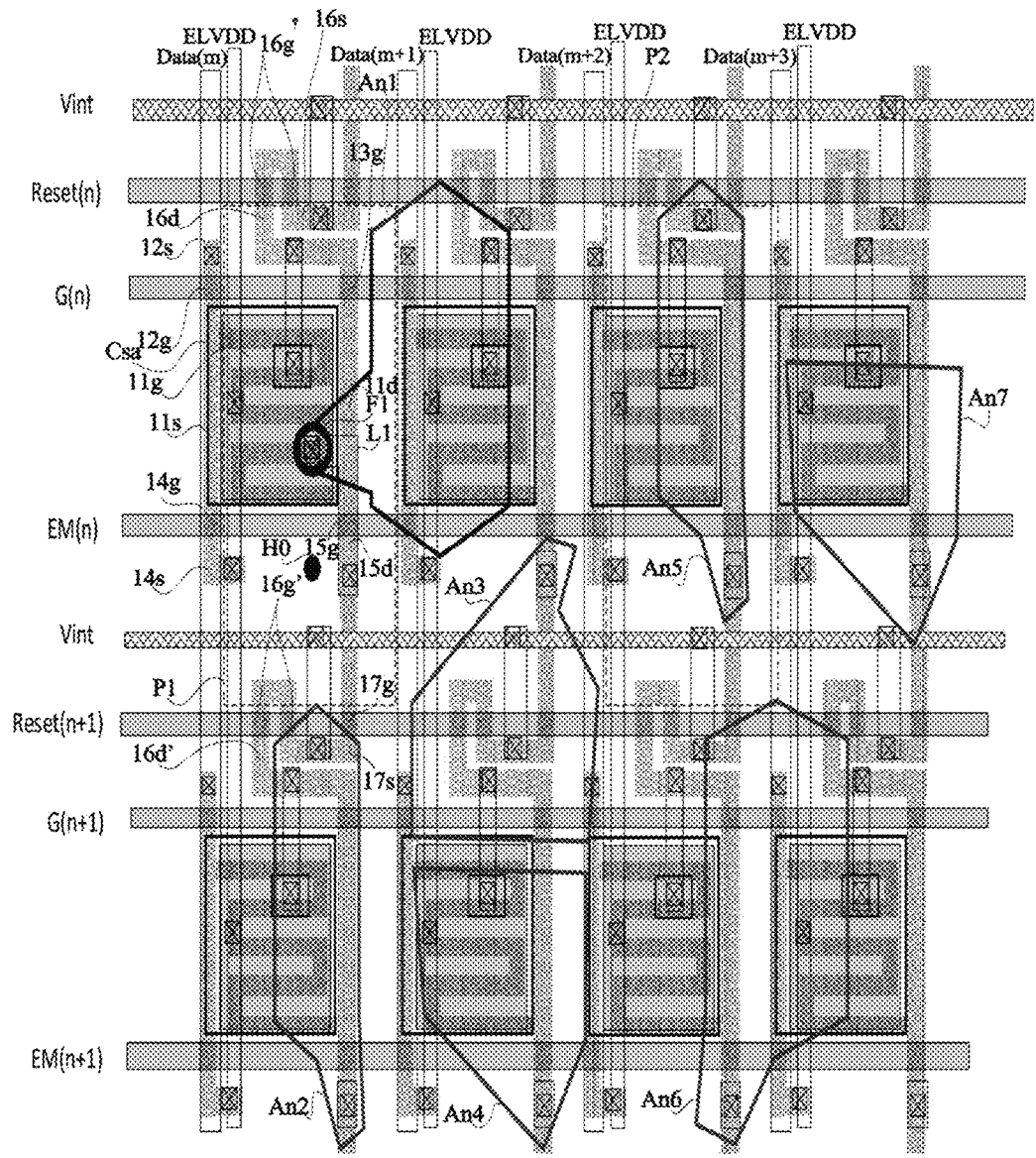
FIG. 11 is a schematic diagram of a layout implementation in which data lines, pixel regions, and anodes included in the anode layer are added on the basis of FIG. 8.

In FIG. 11, on the basis of the schematic diagram of the layout implementation shown in FIG. 10, the (m+2)-th column data line Data (m+2), the (m+3)-th column data line Data (m+3) and two columns of power supply voltage lines are added; additionally, a fifth anode An5 included in the anode layer, a sixth anode An6 included in the anode layer, and a seventh anode An7 included in the anode layer are added. The first anode An1 to the seventh anode An7 have shapes different from each other. That is, each anode may correspond to a pixel region of one row and one column, such as a pixel region of the n-th row and the m-th column, or may correspond to a pixel region of multiple rows and multiple columns, resulting in different shapes of the anodes.

In FIG. 11, An1 may be the anode of a blue organic light-emitting diode, An5 may be the anode of a red organic light-emitting diode, and An7 may be the anode of a green organic light-emitting diode, but the present disclosure is not limited thereto.

In FIG. 11, the pixel region enclosed by Reset (n), Reset (n+1), Data (m), and Data (m+1) is provided with the imaging pinhole H0, but the present disclosure is not limited to this.

In some embodiments, the pixel region enclosed by Reset(n), Reset(n+1), Data(m), and Data(m+1) may be referred to as the first pixel region P1, and the pixel region enclosed by Reset(n), Reset(n+1), Data (m+2), and Data (m+3) may be referred to as the second pixel region P2. As shown in FIGS. 8 and 9, the imaging pinhole H0 and the connection pattern L0 need to be separated by a certain distance, and the orthographic projection of the light leakage gap F1 between the connection pattern L0 and the light-shielding pattern SE onto the base substrate needs to be covered by an orthographic projection of a metal electrode (for example, the electrode plate of the storage capacitor) included in the array layer onto the base substrate. However, due to the limitation of process precision, the width of the light leakage gap F1 cannot be infinitely narrow. The radius of the imaging pinhole H0, the size of the connection pattern L0 and the distance between the imaging pinhole H0 and the connection pattern L0 are also limited by the process precision and cannot be infinitely small. Therefore, the area of each pattern of the pixel region provided with the imaging pinhole can be appropriately enlarged compared to the area of each pattern of the pixel region not provided with the imaging pinhole, so as to ensure that the orthographic projection of the light leakage gap F1 between the connection pattern L0 and the light-shielding pattern SE onto the base substrate is covered by the orthographic projection of a metal electrode (for example, the electrode plate of the storage capacitor) included in the array layer onto the base substrate.

In addition, since the area of each pattern of the pixel region provided with the imaging pinhole is appropriately enlarged compared to the area of each pattern of the pixel region not provided with the imaging pinhole, the area of the first pixel region is larger than the area of the second pixel region.

In some embodiments, the area of the first pixel region enclosed by Reset(n), Reset(n+1), Data(m), and Data(m+1) is larger than the area of the second pixel region enclosed by Reset(n), Reset(n+1), Data(m+2) and Data(m+3), and it may result from the fact that the distance between Data(m) and Data(m+1) is greater than the distance between Data(m+2) and Data(m+3).

In some embodiments, an aspect ratio of the switching transistor in the first pixel region is less than an aspect ratio of the switching transistor in the second pixel region, so as to reduce a current value of the photo-generated leakage current of the switching transistor in the first pixel region, thereby increasing the display grayscale accuracy, but the present disclosure is not limited to this.

The method for manufacturing a display substrate according to an embodiment of the present disclosure may include:

forming an array layer on the base substrate; wherein the array layer includes a driving transistor and a switching transistor, and the switching transistor is a transistor connected to a gate electrode of the driving transistor;

forming a light-shielding layer on a side of the array layer away from the base substrate; forming a plurality of imaging pinholes in the light-shielding layer; wherein a first orthographic projection of the imaging pinholes onto the base substrate and a second orthographic projection of an active layer pattern of the switching transistor in the array layer onto the base substrate do not overlap at least in part.

In the manufacturing method of display panel according to the embodiment of the present disclosure, the imaging pinholes formed in the light shielding layer are arranged to not correspond to the active layer pattern of the switching transistor in the array layer, so that the light passing through the imaging pinholes will not affect the active layer pattern of the switching transistor, and the switching transistor in off state will not have photo-generated leakage current due to the irradiation of light, thereby not affecting the potential of the gate electrode of the driving transistor, and avoiding the problem of inaccurate display grayscale.

In a specific implementation, the step of providing an array layer on the base substrate may include: sequentially providing an active layer, a gate insulating layer, a first gate metal layer, a first insulating layer, a second gate metal layer, an interlayer dielectric layer, a first source-drain metal layer, and a second insulating layer on the base substrate; forming a first via hole that penetrates the second insulating layer; the method for manufacturing the display substrate further includes:

forming a light-shielding pattern and a connection pattern on the light-shielding layer; the light-shielding pattern has the imaging pinholes; and there is a light leakage gap between the light-shielding pattern and the connection pattern;

sequentially providing an planarization layer and an anode layer on a side of the light shielding layer away from the second insulating layer; forming a second via hole that penetrates the planarization layer;

the first source-drain metal layer is electrically connected to the anode layer through the first via hole, the connection pattern, and the second via hole;

an orthographic projection of the light leakage gap onto the base substrate is covered by an orthographic projection of a metal electrode included in the array layer onto the base substrate. Thus, the accuracy of pinhole-imaging based fingerprint recognition is improved.

The display panel according to the embodiment of the present disclosure includes the display substrate described above.

The display device according to the embodiment of the present disclosure includes the display panel described above.

The display device provided by the embodiment of the present disclosure may be any product or component with a display function, such as a mobile phone, a tablet computer, a television, a display, a notebook computer, a digital photo frame, or a navigator.

The above descriptions describe optional implementations of the present disclosure. It is appreciated, modifications and improvements may be made by a person of ordinary skill in the art without departing from the principle of the present disclosure, and these modifications and improvements shall be deemed as falling within the scope of the present disclosure.

What is claimed is:

1. A display substrate, comprising: an array layer on a base substrate, and a light shielding layer on a side of the array layer away from the base substrate,
   wherein the array layer comprises a driving transistor and a switching transistor, the switching transistor is a transistor connected to a gate electrode of the driving transistor, a plurality of imaging pinholes are formed in the light shielding layer, and a first orthographic projection of the imaging pinholes onto the base substrate and a second orthographic projection of an active layer pattern of the switching transistor in the array layer onto the base substrate do not overlap at least in part;
   wherein, an orthographic projection of a channel region in an active layer pattern of a control transistor in the array layer onto the base substrate is a third orthographic projection, and an orthographic projection of a channel region in an active layer pattern of the driving transistor onto the base substrate is a fourth orthographic projection;
   an orthographic projection of a channel region in the active layer pattern of the switching transistor onto the base substrate is a fifth orthographic projection;
   a shortest distance between an edge of the first orthographic projection and the fifth orthographic projection is greater than a distance between the edge of the first orthographic projection and the third orthographic projection;
   the shortest distance between the edge of the first orthographic projection and the fifth orthographic projection is greater than a distance between the edge of the first orthographic projection and the fourth orthographic projection;
   the control transistor is a transistor in the array layer that is other than the switching transistor and the driving transistor.

2. The display substrate according to claim 1, further comprising: a first pixel region provided with an imaging pinhole, and a second pixel region not provided with an imaging pinhole;
   wherein an area of the first pixel region is larger than an area of the second pixel region.

3. The display substrate according to claim 2, wherein an aspect ratio of the switching transistor in the first pixel region is less than an aspect ratio of the switching transistor in the second pixel region.

4. The display substrate according to claim 1, wherein the first orthographic projection and an orthographic projection of a first gate metal layer, a second gate metal layer and a first source-drain metal layer comprised in the array layer onto the base substrate do not overlap;
   wherein the first gate metal layer forms gate electrodes of the driving transistor, the switching transistor and the control transistor; the second gate metal layer forms an initial voltage line providing an initial voltage to the switching transistor and the control transistor; and the first source-drain metal layer forms source electrodes and drain electrodes of the driving transistor, the switching transistor and the control transistor.

5. The display substrate according to claim 1, wherein a diameter of each of the imaging pinholes is greater than or equal to 2 um, and less than or equal to 20 um.

6. The display substrate according to claim 5, wherein the diameter of each of the imaging pinholes is greater than or equal to 4 um, and less than or equal to 7 um.

7. The display substrate according to claim 1, wherein N pixel regions are each provided with one of the plurality of imaging pinholes, and N is a positive integer greater than or equal to 3, and less than or equal to 10.

8. The display substrate according to claim 1, wherein the array layer comprises an active layer, a first gate metal layer, a second gate metal layer, and a first source-drain metal layer that are sequentially provided between the base substrate and the light shielding layer; the display substrate further comprises an anode layer;
   the light-shielding layer comprises a light-shielding pattern and a connection pattern; the light-shielding pattern has the imaging pinholes; wherein a light leakage gap is between the light-shielding pattern and the connection pattern;
   the first source-drain metal layer is electrically connected to the anode layer;
   wherein the active layer comprises active layer patterns of the driving transistor, the switching transistor and the control transistor; the first gate metal layer forms gate electrodes of the driving transistor, the switching transistor and the control transistor; the second gate metal layer forms an initial voltage line providing an initial voltage to the switching transistor and the control transistor; and the first source-drain metal layer forms source electrodes and drain electrodes of the driving transistor, the switching transistor and the control transistor.

9. The display substrate according to claim 1, wherein the array layer is a thin film transistor array layer.

10. The display substrate according to claim 1, wherein the thin film transistor array layer comprises the array layer and a second source-drain metal layer, and the second source-drain metal layer is reused as the light shielding layer.

11. The display substrate according to claim 1, wherein the channel region of the active layer pattern of the driving transistor is of a zigzag shape, the zigzag shape comprises a plurality of first portions and a plurality of second portions, and the plurality of first portions are consecutively connected, with one of the plurality of second portions being connected between every two adjacent first portions, to form the zigzag shape.

12. A display panel, comprising the display substrate according to claim 1.

13. A display device, comprising the display panel according to claim 12.

* * * * *